(12) United States Patent
    Meyer-Berg

(10) Patent No.: US 8,669,175 B2
(45) Date of Patent: Mar. 11, 2014

(54) SEMICONDUCTOR DEVICE AND MANUFACTURING OF THE SEMICONDUCTOR DEVICE

(75) Inventor: Georg Meyer-Berg, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/591,777

(22) Filed: Aug. 22, 2012

(65) Prior Publication Data

US 2012/0322210 A1    Dec. 20, 2012

Related U.S. Application Data

(62) Division of application No. 12/115,191, filed on May 5, 2008, now Pat. No. 8,264,085.

(51) Int. Cl.
    *H01L 21/4763*    (2006.01)
(52) U.S. Cl.
    USPC ............................ 438/618; 438/638; 257/773
(58) Field of Classification Search
    USPC ................................. 257/222; 438/125, 618
    See application file for complete search history.

(56) References Cited

U.S. PATENT DOCUMENTS

| | | | |
|---|---|---|---|
| 5,621,242 A | 4/1997 | Mok et al. | |
| 6,309,915 B1 | 10/2001 | Distefano | |
| 6,991,966 B2 | 1/2006 | Tuominen | |
| 7,238,602 B2 | 7/2007 | Yang | |
| 7,517,722 B2 | 4/2009 | Goller et al. | |
| 7,609,527 B2 | 10/2009 | Tuominen et al. | |
| 7,673,387 B2 | 3/2010 | Tuominen et al. | |
| 7,696,005 B2 | 4/2010 | Iihola et al. | |
| 7,719,851 B2 | 5/2010 | Tuominen et al. | |
| 7,989,944 B2 | 8/2011 | Tuominen | |
| 8,034,658 B2 | 10/2011 | Tuominen et al. | |
| 8,062,537 B2 | 11/2011 | Tuominen et al. | |
| 8,076,586 B2 | 12/2011 | Tuominen et al. | |
| 8,225,499 B2 | 7/2012 | Tuominen et al. | |
| 8,240,032 B2 | 8/2012 | Iihola et al. | |
| 8,240,033 B2 | 8/2012 | Tuominen et al. | |
| 2001/0040297 A1 | 11/2001 | Yoon et al. | |
| 2001/0051393 A1 | 12/2001 | Ogino et al. | |
| 2002/0123214 A1* | 9/2002 | Zuhoski et al. | 438/612 |

(Continued)

FOREIGN PATENT DOCUMENTS

| | | |
|---|---|---|
| DE | 4238113 | 5/1994 |
| DE | 10240460 | 3/2004 |

(Continued)

OTHER PUBLICATIONS

Chan-Yen Chou, et al., "Investigation of Stress-buffer-enhanced Package Subjected to Board-level Drop Test", EurosimE, IEEE, 2008 (1 pg.).

(Continued)

*Primary Examiner* — Ajay K Arora
(74) *Attorney, Agent, or Firm* — Dicke, Billig & Czaja, PLLC

(57) ABSTRACT

A semiconductor device. In one embodiment the device includes a carrier. A first material is deposited on the carrier. The first material has an elastic modulus of less than 100 MPa. A semiconductor chip is placed over the first material. A second material is deposited on the semiconductor chip, the second material being electrically insulating. A metal layer is placed over the second material.

18 Claims, 14 Drawing Sheets

(56) References Cited

U.S. PATENT DOCUMENTS

| | | |
|---|---|---|
| 2003/0230804 A1 * | 12/2003 | Kouno et al. ............... 257/734 |
| 2004/0227238 A1 | 11/2004 | Hashimoto |
| 2005/0029644 A1 | 2/2005 | Ho |
| 2005/0116358 A1 * | 6/2005 | Haba ........................... 257/789 |
| 2005/0269698 A1 | 12/2005 | Okada et al. |
| 2006/0060954 A1 | 3/2006 | Meyer-Berg |
| 2006/0076686 A1 | 4/2006 | Tuominen et al. |
| 2007/0046313 A1 | 3/2007 | Eldridge et al. |
| 2007/0131349 A1 | 6/2007 | Tuominen et al. |
| 2008/0094805 A1 | 4/2008 | Tuominen et al. |
| 2008/0202801 A1 | 8/2008 | Tuominen et al. |
| 2008/0253095 A1 | 10/2008 | Baraton et al. |

FOREIGN PATENT DOCUMENTS

| | | |
|---|---|---|
| DE | 102004058413 | 4/2006 |
| EP | 1617714 | 1/2006 |
| WO | 03065778 | 8/2003 |
| WO | 03065779 | 8/2003 |
| WO | 2004077902 | 9/2004 |
| WO | 2004077903 | 9/2004 |
| WO | 2004089048 | 10/2004 |
| WO | 2005020651 | 3/2005 |
| WO | 2005027602 | 3/2005 |
| WO | 2005104635 | 11/2005 |
| WO | 2005104636 | 11/2005 |
| WO | 2005125298 | 12/2005 |
| WO | 2006013230 | 2/2006 |
| WO | 2006056643 | 6/2006 |
| WO | 2006056648 | 6/2006 |
| WO | 2006134216 | 12/2006 |
| WO | 2006134217 | 12/2006 |
| WO | 2006134220 | 12/2006 |
| WO | WO 2008091023 A1 * | 7/2008 |

OTHER PUBLICATIONS

Final Office Action mailed Jun. 29, 2011 in U.S. Appl. No. 12/115,191.

Non-Final Office Action mailed Jan. 4, 2011 in U.S. Appl. No. 12/115,191.

Final Office Action mailed Sep. 15, 2010 in U.S. Appl. No. 12/115,191.

Non-Final Office Action mailed Apr. 1, 2010 in U.S. Appl. No. 12/115,191.

* cited by examiner

SEMICONDUCTOR DEVICE AND MANUFACTURING OF THE SEMICONDUCTOR DEVICE

CROSS-REFERENCE TO RELATED APPLICATIONS

This Utility Patent Application is a divisional application of U.S. application Ser. No. 12/115,191, filed May 5, 2008, which is incorporated herein by reference.

BACKGROUND

This invention relates to a semiconductor device and a method of manufacturing a semiconductor device.

Semiconductor devices may include carriers on which semiconductor chips may be mounted. Furthermore, semiconductor devices may include electrically conductive layers. Electrically conductive means may be provided so as to provide the coupling between the components of the devices, such as the semiconductor chips and the electrically conductive layers.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
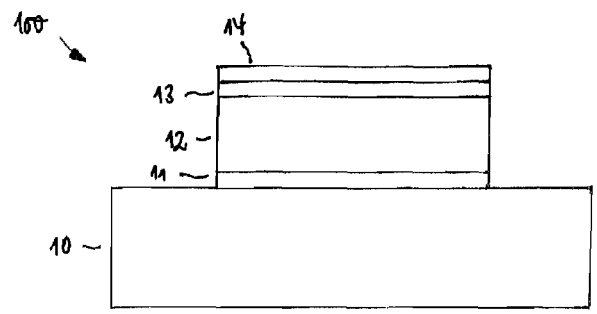
FIG. 1 schematically illustrates a device 100 as one exemplary embodiment.
Figure 2A:
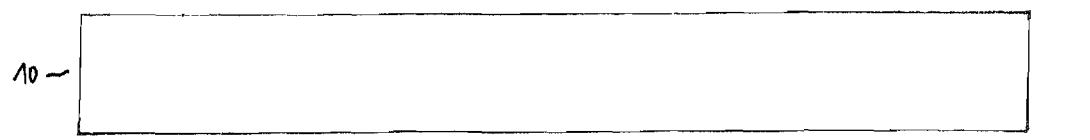
FIGS. 2A to 2D schematically illustrate one exemplary embodiment of a method to fabricate a device.
Figure 2B:
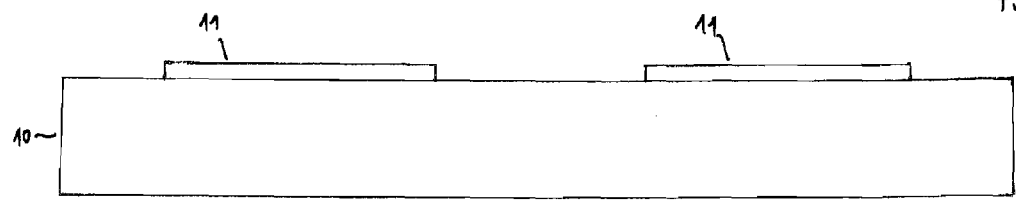
Figure 2C:
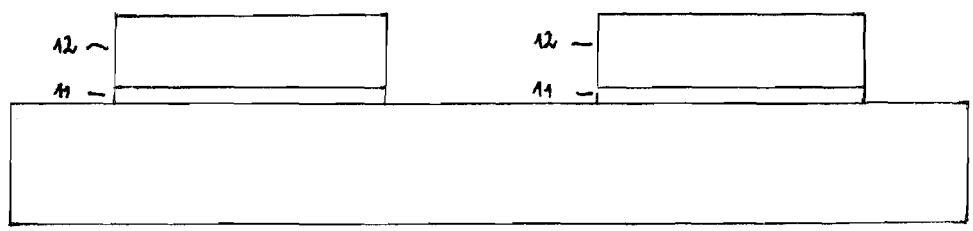
Figure 2D:
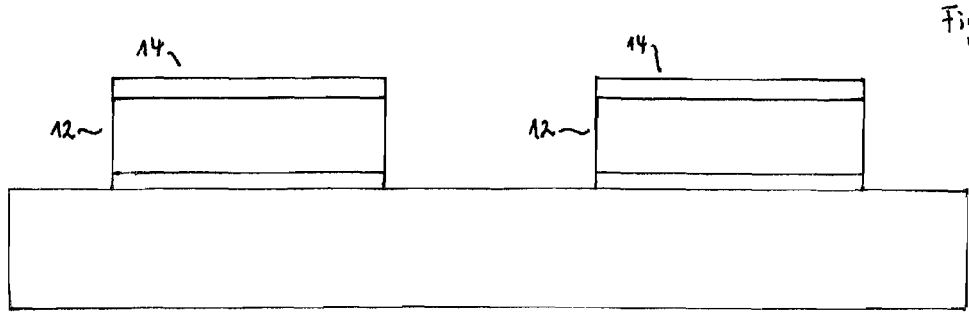
Figure 3A:
FIGS. 3A to 3E schematically illustrate a further exemplary embodiment of a method to fabricate a device.
Figure 3B:
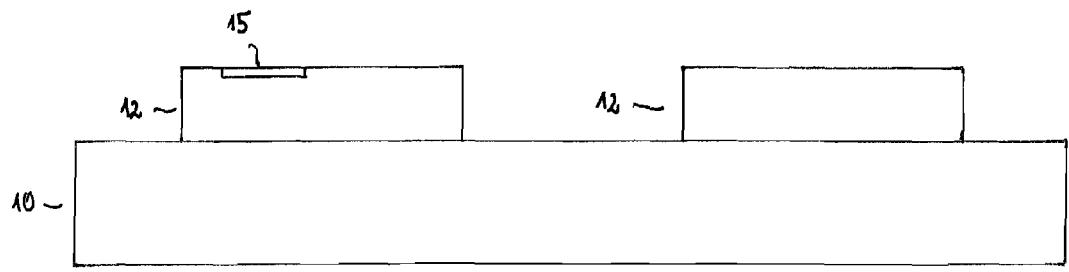
Figure 3C:
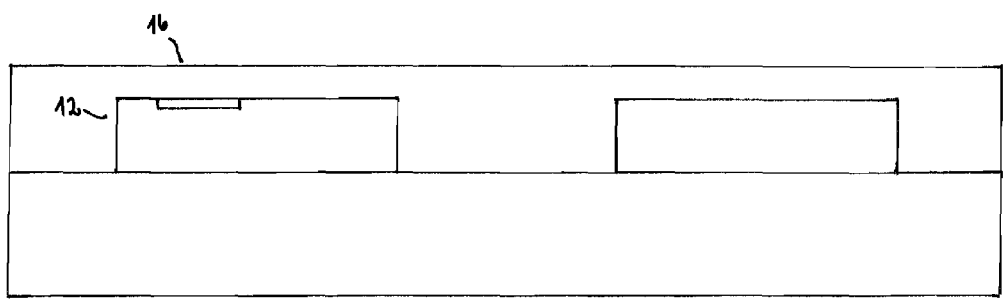
Figure 3D:
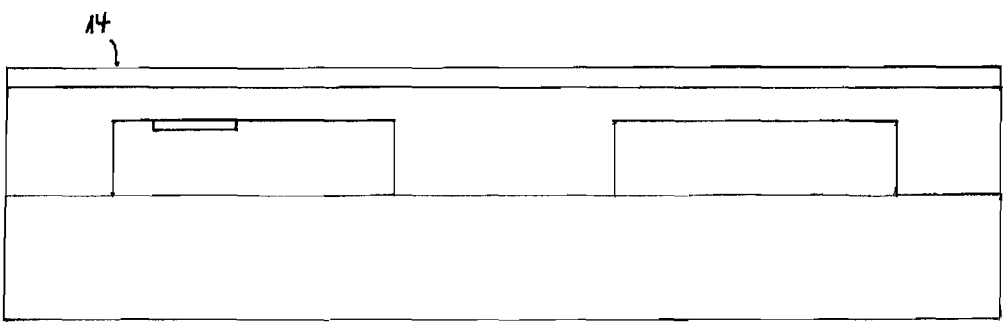
Figure 3E:
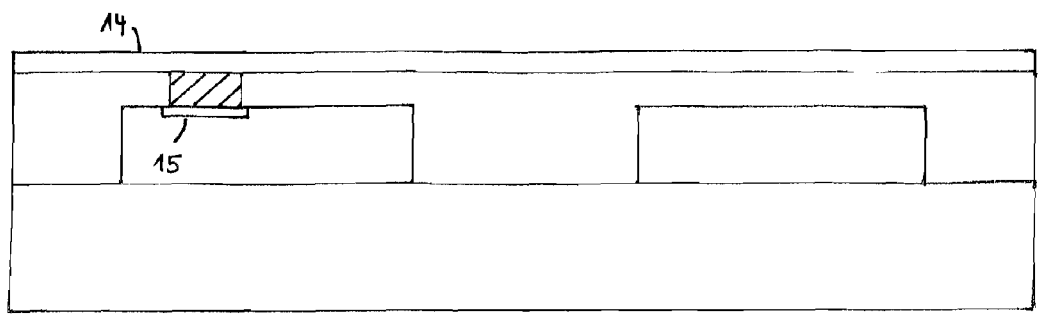

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following embodiments of the invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more embodiments of embodiments of the invention. It may be evident, however, to one skilled in the art that one or more embodiments of the embodiments of the invention may be practiced with a lesser degree of these specific details. The following description is therefore not to be taken in a limiting sense, and the scope of the invention is defined by the appended claims.

Devices with semiconductor chips are described below. The semiconductor chips may be of extremely different types and may include for example integrated electrical, electro-optical, electro-mechanical or electro-biological circuits. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include logic circuits, control circuits, microprocessors or microelectromechanical components. In particular, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in particular on its two main surfaces, that is to say on its top side and bottom side. In particular, power semiconductor chips may have a vertical structure. Furthermore, the devices described below may include integrated circuits to control the integrated circuits of other semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips may have contact elements (or contact pads or electrodes) which allow electrical contact to be made with the integrated circuits included in the semiconductor chips. One or more metal layers may be applied to the contact elements of the semiconductor chips. The metal layers may be manufactured with any desired geometric shape and any desired material composition. The metal layers may, for example, be in the form of a layer covering an area. Any desired metal or metal alloy, for example from aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on carriers. The carriers may be of any shape, size or material. During the fabrication of the devices the carriers may be connected to each other. The carriers may also be made from one piece. The carriers may be connected among each other by connection means with the purpose of separating some of the carriers in the course of the fabrication. Separation of the carriers may be carried out by mechanical sawing, a laser beam, cutting, stamping, milling, etching or any other appropriate method. The carriers may be electrically conductive. They may be fabricated from metals or metal alloys, in particular copper, copper alloys, iron nickel, aluminum, aluminum alloys, or other appropriate materials. The carriers may be, for example, a leadframe or a part of a leadframe. Furthermore, the carriers may be plated with an electrically conductive material, for example copper, silver, iron nickel or nickel phosphorus.

The devices may include electrically insulating material. The electrically insulating material may cover any fraction of any number of surfaces of the components of the device. The electrically insulating material may serve various functions. It may be used, for example, to electrically insulate components of the device from each other and/or from external components, but the electrically insulating material may also be used as a platform to mount other components, for example wiring layers. The electrically insulating material may be used to produce fan-out type packages. In a fan-out type package at least some of the external contact elements and/or conductor tracks connecting the semiconductor chip to the external contact elements are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards etc. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The electrically insulating material may be deposited on the components of the device using various techniques. For example, the electrically insulating material may be deposited by printing or from a gas phase or a solution or by using any other appropriate method. The electrically insulating material may, for example, contain silicone material or may entirely consist of silicone (or polymerized siloxanes or polysiloxanes). The electrically insulating material may have an elastic modulus of, for example, less than 100 MPa. The electrically insulating material may be thermally conducting so that it can dissipate the heat generated by the semiconductor chips. It may also be provided that the devices contain electrically insulating material that is thermally insulating.

One or more electrically conductive layers may be placed over the semiconductor chips and/or the electrically insulating material. The electrically conductive layers may, for example, be used to produce a redistribution layer. The electrically conductive layers may be used as wiring layers to make electrical contact with the semiconductor chips from outside the devices or to make electrical contact with other semiconductor chips and/or components contained in the devices. The electrically conductive layers may be manufactured with any desired geometric shape and any desired material composition. The electrically conductive layers may, for example, be composed of conductor tracks, but may also be in the form of a layer covering an area. Any desired electrically conductive materials, such as metals, for example copper, aluminum, nickel, palladium, silver, tin or gold, metal alloys, metal stacks or organic conductors, may be used as the material. The electrically conductive layers need not be homogenous or manufactured from just one material, that is to say various compositions and concentrations of the materials contained in the electrically conductive layers are possible. Furthermore, the electrically conductive layers may be arranged above or below or between electrically insulating layers.

The semiconductor chips and the electrically conductive layers may be joined by soldering. Soldering is a process in which two or more items, such as metal items, are joined together by melting and flowing a solder material into the joint. In order to solder the semiconductor chips to the electrically conductive layers, solder material may be deposited on the semiconductor chips, in particular one or more contact elements of the semiconductor chips.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conducting and may serve as heat sinks for dissipating the heat generated by the semiconductor chips. The external contact elements may be composed of any desired electrically conducting material, for example of a metal, such as copper, aluminum or gold, a metal alloy or an electrically conducting organic material. Solder material may be deposited on the external contact elements.

FIG. 1 schematically illustrates a device 100. The device 100 includes a carrier 10. A first material 11 is deposited on the carrier 10. The first material 11 has an elastic modulus of less than 100 MPa. A semiconductor chip 12 is placed over the first material 11. A second material 13, which is electrically insulating, is deposited on the semiconductor chip 12. A metal layer 14 is placed over the second material 13.

FIGS. 2A to 2D schematically illustrate a method for production of a semiconductor device. Firstly, a carrier 10 is provided (see FIG. 2A). A first material 11 which contains silicone is deposited on the carrier 10 (see FIG. 2B). Over the first material 11 at least two semiconductor chips 12 are placed (see FIG. 2C). A metal layer 14 is applied over the at least two semiconductor chips 12 (see FIG. 2D).

FIGS. 3A to 3E and 4 schematically illustrate a production method and a device that include components similar or identical to the components of the device 100 and the production method illustrated in FIGS. 2A to 2D. Therefore similar or identical components of the devices and methods are denoted by the same reference numerals.

FIGS. 3A to 3E schematically illustrate a method for production of a semiconductor device. Firstly, a carrier 10 is provided (see FIG. 3A). At least two semiconductor chips 12 are attached to the carrier 10 (see FIG. 3B). The semiconductor chips 12 include at least one contact element 15. The carrier 10 and the semiconductor chips 12 are covered with an electrically insulating material 16 (see FIG. 3C). A metal foil 14 is applied over the semiconductor chips 12 (see FIG. 3D). The metal foil 14 is soldered to the contact element 15 (see FIG. 3E).

Figure 4:
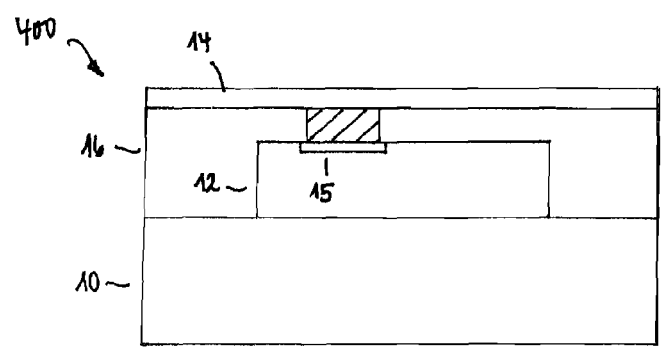
FIG. 4 schematically illustrates a device as a further exemplary embodiment.

FIG. 4 schematically illustrates a device 400 including a carrier 10 and a semiconductor chip 12 attached to the carrier 10. The semiconductor chip 12 includes at least one contact element 15. An electrically insulating material 16 covers the carrier 10 and the semiconductor chip 12. A metal foil 14 covers the semiconductor chip 12 and is soldered to the contact element 15.

Figure 5A:
FIGS. 5A to 5K schematically illustrate an exemplary embodiment of a method to fabricate a device.
Figure 5B:
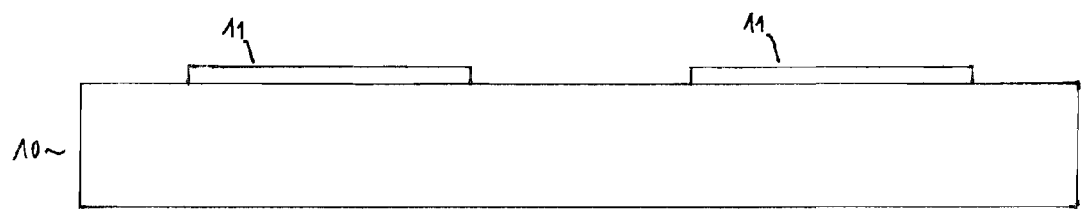
Figure 5C:
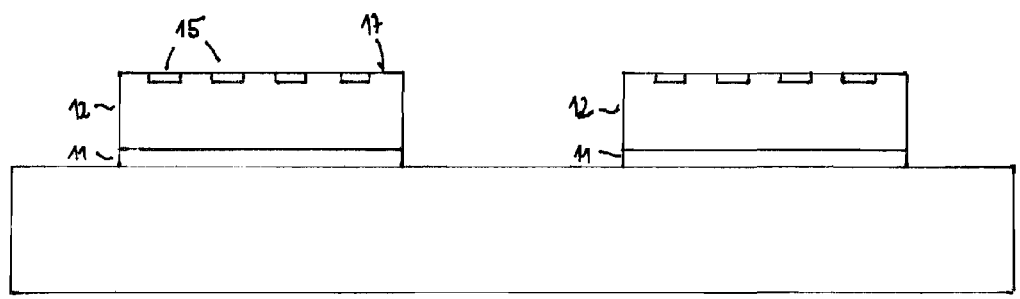
Figure 5D:
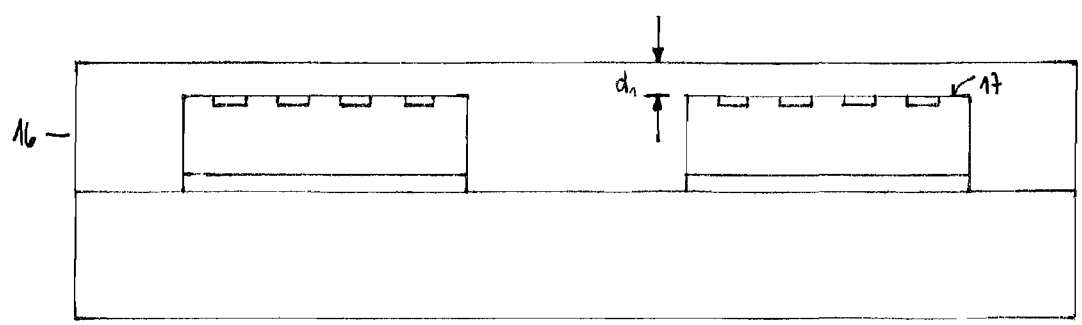
Figure 5E:
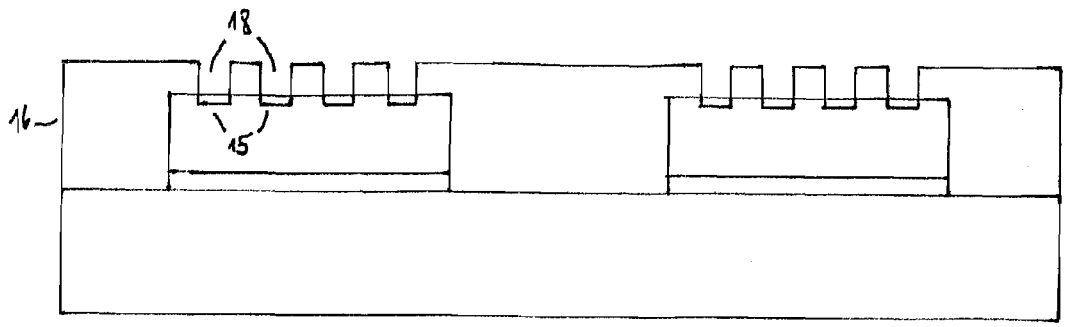
Figure 5F:
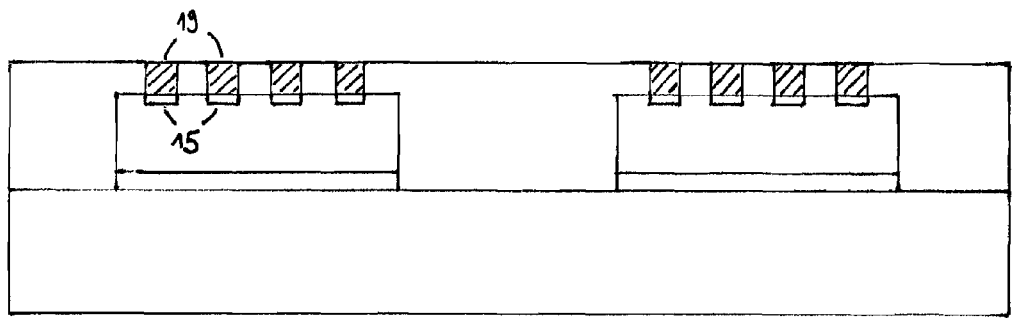
Figure 5G:
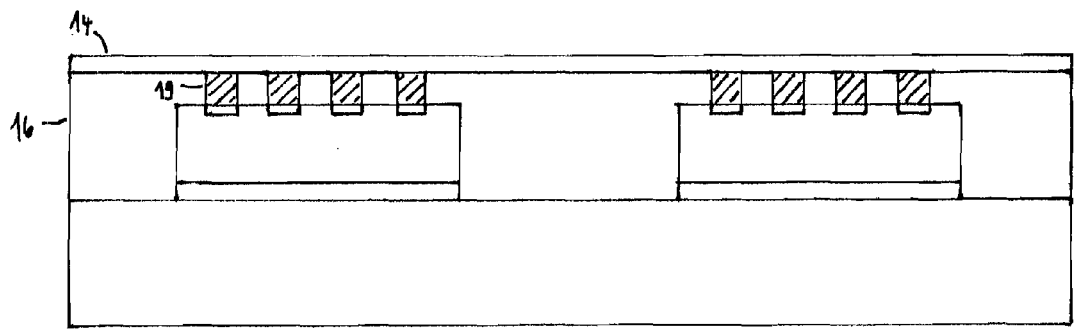
Figure 5H:
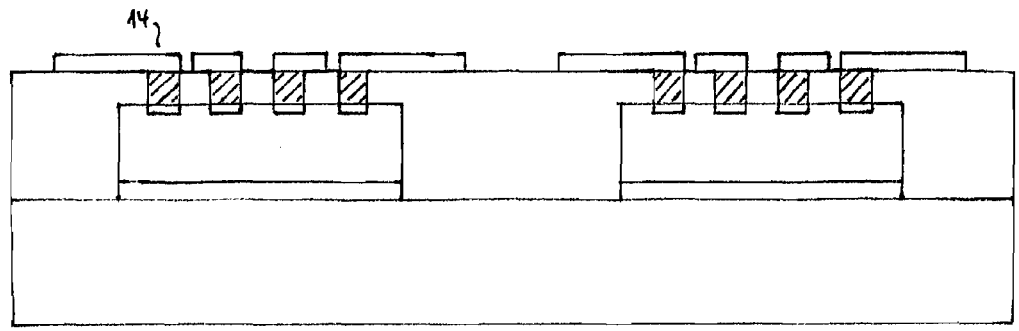
Figure 5I:
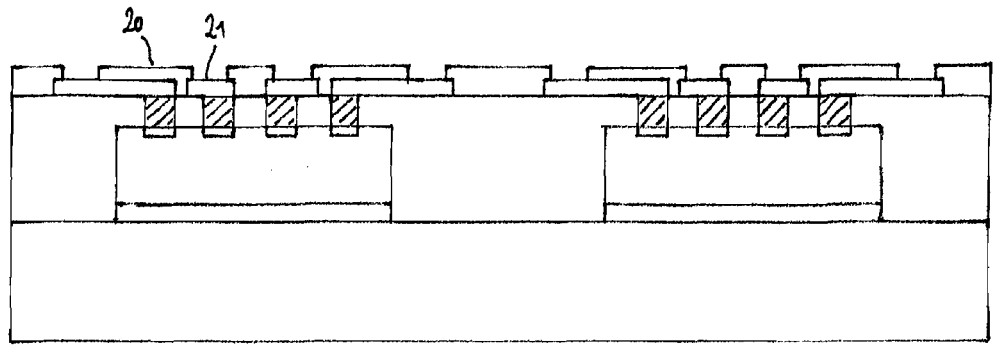
Figure 5J:
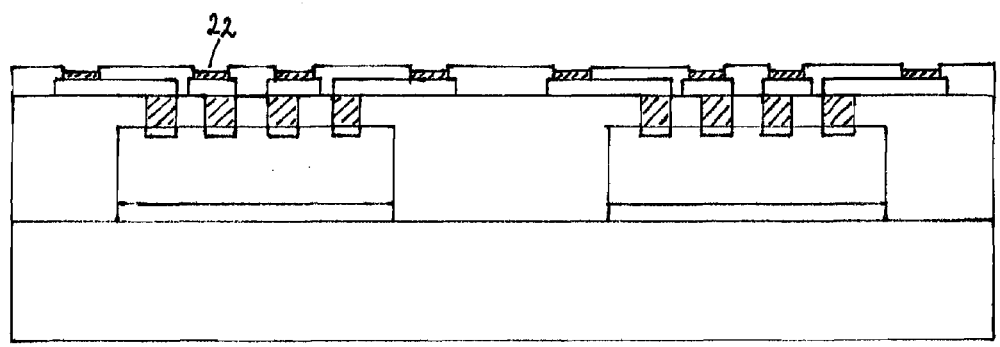
Figure 5K:
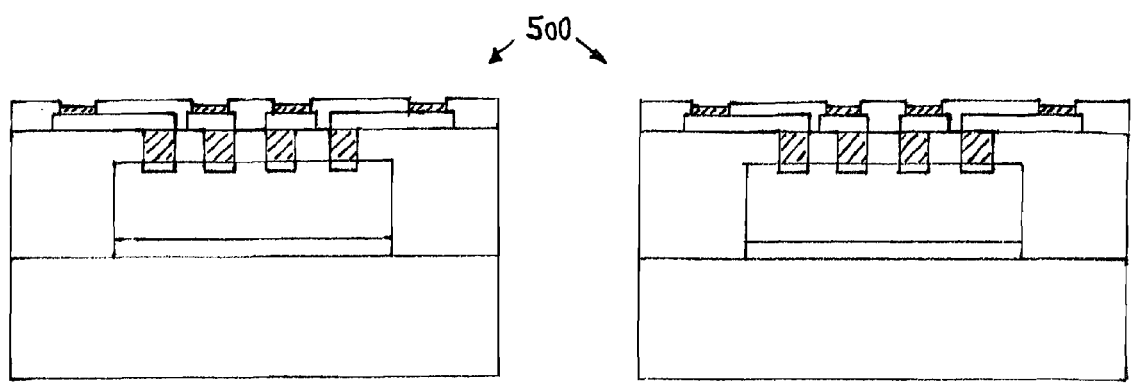

FIGS. 5A to 5K schematically illustrate a method for production of a device 500, a cross section of which is illustrated in FIG. 5K. The method illustrated in FIGS. 5A to 5K is an implementation of the methods illustrated in FIGS. 2A to 2D and FIGS. 3A to 3E. Furthermore, the device 500 is an implementation of the devices 100 and 400 illustrated in FIGS. 1 and 4. The details of the production method that are described below can therefore be likewise applied to the methods of FIGS. 2A to 2D and FIGS. 3A to 3E. Moreover, the details of the device 500 can be likewise applied to the devices 100 and 400.

As illustrated in FIG. 5A, the carrier 10 is provided which may be electrically conductive. The carrier 10 may be a plate or a foil made of a rigid material, for example a metal or a metal alloy, such as copper, aluminum, nickel, CuFeP, steel or stainless steel. The carrier 10 may have a flat upper surface on which the semiconductor chips 12 are placed later on. The shape of the carrier 10 is not limited to any geometric shape, and the carrier 10 may have any appropriate size. For example, the thickness of the carrier 10 may be in the range from 50 µm to 1 mm. Furthermore, the carrier 10 may be structured. The carrier 10 may be, for example, a leadframe or a part of a leadframe. Moreover, the carrier 10 may be plated with an electrically conductive material, for example copper, silver, iron nickel or nickel phosphorus.

A material 11, for example an adhesive material, may be deposited on the upper surface of the carrier 10 as illustrated in FIG. 5B. The adhesive material 11 may be made of a polymer or any other suitable material. The adhesive material 11 may contain silicone, i.e., polymerized siloxanes or polysiloxanes, or fluorinated silicone or may be entirely made of silicone. The adhesive material 11 may further be a mixture of silicone and epoxy resin or a mixture of silicone and polyimide. After hardening, the adhesive material 11 may have an elastic modulus of less than 100 MPa, in particular less than 50 MPa or 20 MPa or 10 MPa or 5 MPa or 2 MPa or 1 MPa or 500 kPa or 200 kPa or 100 kPa or 50 kPa or 20 kPa. The elastic modulus is also known as the Young's modulus, modulus of elasticity or tensile modulus. The elastic modulus may be defined as the ratio of stress, which has units of pressure, to strain, which is dimensionless; therefore the elastic modulus itself has units of pressure.

The elastic modulus of the adhesive material 11 as described above may allow a floating mounting of the semiconductor chips 12. Due to the different thermal expansion coefficients of the carrier 10 and the semiconductor chips 12, floating mounting of the semiconductor chip 12 is desired to reduce the mechanical stress induced during temperature cycles. As an example, copper of which the carrier 10 may be manufactured has a thermal expansion coefficient of about $17 \times 10^{-6}$/K and silicon of which the semiconductor chips 12 may be manufactured has a thermal expansion coefficient of about $3 \times 10^{-6}$/K.

The adhesive material 11 may have a thermal conductivity for example in the range between 0.1 W/mK and 5 W/mK or higher. Alternatively, the adhesive material 11 may be thermally insulating. The adhesive material 11 may exhibit low outgassing during cure and in particular high thixotropy. Elastosil may be used for the adhesive material 11, for example Elastosil RT705, which is commercially available.

The adhesive material 11 may be deposited at those places of the upper surface of the carrier 10 where the semiconductor chips 12 are placed later on. When deposited the adhesive material 11 may be fluid, viscous or waxy. The deposition of the adhesive material 11 may, for example, be performed by stencil printing, screen printing, dispensing or any other appropriate method.

As illustrated in FIG. 5C, the semiconductor chips 12 as well as possibly further semiconductor chips are placed over the island of the adhesive material 11 deposited on the carrier 10. Although the island of the adhesive material 11 and the semiconductor chips 12 have the same surface areas in FIG. 5C, their surface areas may be different. The semiconductor chips 12 may be arranged in an array. Furthermore, any suitable array of semiconductor chips may be placed on the carrier 10 (only two of the semiconductor chips are illustrated in FIG. 5C). For example, more than 50 or 500 or 1000 semiconductor chips may be placed on the carrier 10. The semiconductor chips 12 are relocated on the carrier 10 in larger spacing as they have been in the wafer bond. The semiconductor chips 12 may have been manufactured on the same semiconductor wafer, but may alternatively have been manufactured on different wafers. Furthermore, the semiconductor chips 12 may be physically identical, but may also contain different integrated circuits and/or represent other components and/or may have different outer dimensions and/or geometries. The semiconductor chips 12 may have a thickness in the range between 50 µm and several hundred micrometers. The semiconductor chips 12 have active main surfaces 17 and are arranged over the carrier 10 with their active main surfaces 17 facing away from the carrier 10. Contact elements 15 are located on the active main surfaces 17. The integrated circuits embedded in the semiconductor chips 12 can be electrically accessed via the contact elements 15. The contact elements 15 may be contact pads made of a metal, for example aluminum or copper. The contact elements 15 may be irregularly arranged and may differ in terms of size and geometry.

A pick-and-place tool may be used capable of picking the semiconductor chips 12 and placing them on the adhesive material 11. The semiconductor chips 12 may be pressed in the adhesive material 11 and may be allowed to sink up to 100% of their thickness.

After the placement of the semiconductor chips 12, the adhesive material 11 may be cured (hardened) by a heat treatment at moderate temperatures, for example temperatures of less than 200° C. or 140° C. or 100° C. for several minutes. The heat treatment may be performed by using a hot plate or an oven.

Photo imaging may be performed to store the positions and angles of the semiconductor chips 12 placed on the carrier 10. Depending on the accuracy of the positioning system used to place the semiconductor chips 12, photo imaging may not be necessary.

Before the deposition of the electrically insulating material 16 a leveling process may be performed to align the upper main surfaces 17 of the semiconductor chips 12. For that, a further carrier, for example a wafer, may be pressed onto the semiconductor chips 12 or onto solder deposits or electrically conductive glue or any other electrically conductive material deposited on the contact elements 15 of the semiconductor chips 12. The leveling process may be performed before or after the adhesive material 11 is hardened.

As illustrated in FIG. 5D, the electrically insulating material 16 is deposited on the semiconductor chips 12 and the exposed surfaces of the carrier 10. The gaps between the semiconductor chips 12 are also filled with the electrically insulating material 16. In one embodiment, the height $d_1$ of the electrically insulating material 16 above the active main surfaces 17 of the semiconductor chips 12 may be at least 10 µm and in particular around 30 µm. After its deposition the electrically insulating material 16 may provide planar sections on its upper surface, which are coplanar to the upper surface of the carrier 10. These planar surfaces may be used to mount other components, such as a redistribution layer.

The electrically insulating material 16 used for embedding the semiconductor chips 12 may be made of a polymer or any other suitable material. The electrically insulating material 16 may contain silicone or fluorinated silicone or may be entirely made of silicone. The electrically insulating material 16 may further be a mixture of silicone and epoxy resin or a mixture of silicone and polyimide. After hardening, the electrically insulating material 16 may have an elastic modulus of less than 100 MPa, in particular less than 50 MPa or 20 MPa or 10 MPa or 5 MPa or 2 MPa or 1 MPa or 500 kPa or 200 kPa or 100 kPa or 50 kPa or 20 kPa. In particular its elastic modulus may be around 3 MPa. The electrically insulating material 16 may have a thermal conductivity for example in the range between 0.1 W/mK and 5 W/mK or higher. The electrically insulating material 16 may exhibit low outgassing during cure and in particular low thixotropy. Elastosil may be used for the electrically insulating material 16 though being highly thixotropic, for example Elastosil RT705, which is commercially available.

The elastic modulus of the electrically insulating material 16 as described above may allow a floating mounting of the semiconductor chips 12 with respect to the metal foil 14 which is placed over the semiconductor chips 12 later on. Due to the different thermal expansion coefficients of the semiconductor chips 12 and the metal foil 14, floating mounting of the semiconductor chip 12 is desired to reduce the mechanical stress induced during temperature cycles.

During its deposition the electrically insulating material 16 may be fluid, viscous or waxy. The deposition of the electrically insulating material 16 may, for example, be performed by stencil printing, screen printing, dispensing or any other appropriate method.

After its deposition, the electrically insulating material 16 may be semi-cured (partially hardened) by a heat treatment at moderate temperatures, for example temperatures of less than 120° C. or 100° C. or 80° C. for several minutes. The heat treatment may be performed by using a hot plate or an oven.

The electrically insulating material 16 may be structured to create cut-outs or through-holes 18 reaching from the upper surface of the electrically insulating material 16 down to the contact elements 15 of the semiconductor chips 12 as illustrated in FIG. 5E. The embodiment ratio of the through-holes 18, which is the ratio of the height to the width of the through-holes 18, may depend on the method used to fill the through-holes 18 with electrically conductive material. The electrically insulating material 16 may, for example, be structured by laser ablation. It may be provided that the diameter of the through-holes 18 is not larger than 50 µm if laser structuring is employed. Laser structuring may be used in particular if the accuracy of the positioning system used to place the semiconductor chips 12 is low, and photo imaging has been performed to store the positions and angles of the semiconductor chips 12 placed on the carrier 10. Alternative techniques to create the through-holes 18 are chemical etching or photolithographic structuring if the electrically insulating material 16 contains a photo-sensitive component. A further alternative is to use a printing technology for the deposition of the electrically insulating material 16, such as stencil printing or screen printing, and to leave at least portions of the contact elements 15 exposed when printing the electrically insulating material 16 on the carrier 10 and the semiconductor chips 12.

First solder material 19 may be placed in the through-holes 18 as illustrated in FIG. 5F. The solder material 19 may be applied by using stencil printing or other suitable printing methods. Alternatively, pre-shaped solder balls having diameters not larger than the diameters of the through-holes 18 may be inserted into the through-holes 18 by brushing or rolling. Furthermore, the solder material 19 or any other electrically conductive material may be filled into the through-holes 18 by using pressure to fill the material in liquid state into the through-holes 18. As an alternative to the solder material 19, other electrically conductive materials, such as electrically conductive glue or nanopastes, may be deposited in the through-holes 18. It may be provided that the solder material 19 protrudes from the upper surface of the electrically insulating material 16 meaning that the solder material 19 deposited in the through-holes 18 has a height larger than $d_1$. The solder material 19 may be made of metal alloys which are composed, for example, from the following materials: SnPb, SnAg, SnAgCu, SnAgCuNi, SnAu, SnCu and SnBi. The solder material 19 may contain flux material which exhibits low outgassing. The contact elements 15 may have a solderable surface.

On top of the electrically insulating material 16 a redistribution layer may be produced. One possibility to produce the redistribution layer is to use a standard PCB (printed circuit board) industry process flow. As illustrated in FIG. 5G, a metal foil 14 may be applied to the upper surface of the electrically insulating layer 16. The metal foil 14 may be made of copper, aluminum or any other metal, metal alloy or metal stack. The thickness of the metal foil 14 may be in the range between 1 and 500 µm and in particular in the range between 5 and 60 µm.

The metal foil 14 may be laminated onto the underlying structures by applying vacuum and pressure for a time suitable to adhere the metal foil 14 to the electrically insulating material 16. Furthermore, heat may be applied during the lamination of the metal foil 14. After the lamination of the metal foil 14 heat and in particular pressure may be applied to melt the solder material 19 embedded in the electrically insulating material 16. The temperature may be in the range between 200 and 400° C. By melting the solder material 19, a soldering process is initiated which produces soldered joints between the contact elements 15 of the semiconductor chips 12 and the metal foil 14. Due to the heat applied during the soldering process, the electrically insulating material 16 may be cured and may connect firmly with the metal foil 14. The metal foil 14 may be perforated to allow outgassing of the electrically insulating material 16 and the solder material 19 during cure.

On top of the metal foil 14, a dry resist film may be laminated, which is photostructurable. Recesses may be formed in the resist film by exposure to light having a suitable wave-length. For that, a laser beam and the data recorded during the photo imaging may be used. If the accuracy of the positioning system used to place the semiconductor chips 12 is high enough, the resist film may selectively exposed to the light of the suitable wave-length emitted through a mask. Subsequently, the resist film is developed and the thereby exposed portions of the metal foil 14 are etched. Afterwards the resist film is stripped off, and only the structured metal foil 14 remains on the electrically insulating material 16 as illustrated in FIG. 5H.

A solder stop layer 20, which may consist of a silicone material and a ductile electrically insulating material, may be applied to the structured metal film 14 and the exposed portions of the electrically insulating material 16 as illustrated in FIG. 5I. The solder stop layer 20 may, for example, be stencil printed or screen printed leaving external contact pads 21 open at appropriate locations. The solder stop layer 20 may be cured and cleaned afterwards. The solder stop layer 20 prevents solder material from bridging between conductor tracks and creating short circuits. The solder stop layer 20 also provides protection from the environment.

As an alternative, the solder stop layer 20 may be photo-structurable. By exposure to light having a suitable wavelength and subsequent development, recesses may be formed in the solder stop layer 20 to expose the external contact pads 21.

Second solder material 22 may be applied onto the surfaces of the external contact pads 21 exposed from the solder stop layer 20 as illustrated in FIG. 5J. The solder material 22 may be applied by printing, for example stencil printing, followed by a heat-treatment process to melt the solder material 22. The external contact pads 21 and the solder material 22 may be used as external connection elements later on to electrically couple the devices 400 to other components, for example a PCB. The external contact pads 22 may be laterally shifted from the contact elements 15 of the semiconductor chips 12. Prior to the application of the solder material 22, the external contact pads 21 may be cleaned, for example by RIE (reactive ion etching) or chemical cleaning, in order to remove solder stop material remained on the external contact pads 22.

As illustrated in FIG. 5K, the devices 500 are separated from one another by separation of the carrier 10, the electrically insulating material 16 and the redistribution layer, for example by sawing, laser ablation or etching.

The bare backside of the carrier 10 may be used to dissipate the heat generated by the semiconductor chip 12 during operation of the device 500. For example, a heat sink or cooling element may be attached to the backside of the carrier 10. Furthermore, the backside may be coated with a protective and/or electrically insulating layer, for example by printing.

The devices 500 manufactured by the method described above are fan-out type packages. The electrically insulating material 16 allows the redistribution layer to extend beyond the outline of the semiconductor chip 12. The external contact pads 21 therefore do not need to be arranged within the outline of the semiconductor chip 12 but can be distributed over a larger area. The increased area which is available for arrangement of the external contact pads 21 as a result of the electrically insulating layer 16 means that the external contact pads 21 cannot only be arranged at a great distance from one another, but that the maximum number of external contact pads 21 which can be arranged there is likewise increased compared to the situation when all the external contact pads 21 are arranged within the outline of the semiconductor chip 12. As an alternative to fan-out type packages, it is also possible to use the method described above for the manufacturing of fan-in type packages.

The devices 500 illustrated in FIG. 5K and the manufacturing thereof as described above are only intended to be an exemplary embodiment, and many variations are possible. For example, semiconductor chips or passives of different types may be included in the same device 500. The semiconductor chips and passives may differ in function, size, manufacturing technology etc.

In case more than one semiconductor chip is included in the same device 500, one of the semiconductor chips may be attached to the carrier 10 by using an adhesive material 11 that is thermally conductive and another one of the semiconductor chips may be attached to the carrier 10 by using an adhesive material 11 that is thermally insulating. In this case the heat generated by the semiconductor chip, which is thermally coupled to the carrier 10 and which may for example be a processor, is transferred to the carrier 10, but not to the semiconductor chip which is thermally decoupled from the carrier 10, which may for example be a DRAM or any other heat sensitive device.

Furthermore, instead of the electrically insulating adhesive material 11, an electrically conductive adhesive material 11 may be used to mount the semiconductor chips 12 on the carrier 10. In the latter case, the adhesive material 11 may be enriched with metal particles, for example gold, silver, nickel or copper particles, in order to produce electrical conductivity. When using an electrically conductive adhesive material 11, an electrical connection between the backside of the semiconductor chip 12 and the carrier 10 is established.

In case the adhesive material 11 being electrically conductive, the semiconductor chips 12 may include logic circuits having ground electrodes on their backsides or any other electrodes. Alternatively, the semiconductor chips 12 may be vertical power diodes or vertical power transistors, for example IGBTs, JFETs, power bipolar transistors or power MOSFETs. In the case of a MOSFET, the semiconductor chip 12 may have a source electrode and a gate electrode on its top surface and a drain electrode is located on the bottom surface of the semiconductor chip 12, which is electrically coupled to the carrier 10 by using the electrically conductive adhesive material 11. In this case, the carrier 10 may not be fully covered with the electrically insulating material 16 and a solder deposit, for example a solder ball, may be placed on the part of the carrier 10 exposed from the electrically insulating material 16 in order to create an external contact element for the drain electrode of the MOSFET.

Depending on the type of the semiconductor chip 12, at least a part of the upper surface 17 of the semiconductor chip 12 may be exposed from the electrically insulating material 16 and the redistribution layer. Such an arrangement may be required if the semiconductor chip 12, for example, contains a microelectromechanical component, such as a microphone or a pressure sensor, or a laser.

In the embodiment described above and illustrated in FIGS. 5A to 5K, the solder material 19 deposited in the through-holes 18 is melted after the lamination of the metal foil 14. As an alternative, the solder material 19 may be melted when the solder material 22 deposited on the external contact pads 21 is melted, i.e., after the deposition of the solder material 19 its melting temperature is not reached until the solder material 22 is melted.

According to a further embodiment, the solder material 19 or any other appropriate electrically conductive material may be deposited on the contact elements 15 of the semiconductor chips 12 before the semiconductor chips 12 are mounted on the carrier 10. For example, the solder material 19 may be deposited on the contact elements 15 when the semiconductor chips 12 are still in the wafer bond. The solder material 15 may, for example, be deposited onto the contact elements 15 by stencil printing, screen printing or any other appropriate printing technique. Alternatively, solder balls may be placed on the contact elements 15. As a further alternative, the solder material 19 may be electrochemically deposited on the contact elements 15 in order to produce the solder bumps. Furthermore, other deposition methods, such as sputtering, may also be used. Depending on the deposition method, structuring processes may be necessary.

The solder material 19 may be made of metal alloys which are composed, for example, from the following materials: SnPb, SnAg, SnAgCu, SnAgCuNi, SnAu, SnCu and SnBi. The solder material 19 may contain flux material as well as solvent. The solder material 19 deposited on the contact elements 15 may have a height of at least 10 μm. It may be provided that the height of the solder bumps 19 is higher than the height $d_1$ of the electrically insulating material 16 above the active main surface 17 of the semiconductor chips 12 (see FIG. 5D). After the deposition of the solder bumps 19, the semiconductor wafer may be diced thereby separating the individual semiconductor chips 12.

According to a further embodiment, the electrically insulating material 16 deposited on top of the semiconductor chips 12 may be different from the electrically insulating material 16 deposited on the exposed surfaces of the carrier 10 and covering the side surfaces of the semiconductor chips 12. The two electrically insulating materials 16 may, for example, differ in terms of their elastic modulus and/or thermal conductivity and/or thixotropy.

According to yet a further embodiment, the electrically insulating material 16 may be deposited using two deposition processes. In a first process, the electrically insulating material 16 is deposited on the exposed parts of the carrier 10 such that the upper surface of the electrically insulating material 16 and the upper surfaces 17 of the semiconductor chips 12 form an essentially common plane. In a second process, a layer of the electrically insulating material 16 having a thickness $d_1$ is deposited on the previously deposited electrically insulating material 16 and the semiconductor chips 12. Alternatively, in the first process, the electrically insulating material 16 is deposited on the exposed parts of the carrier 10 such that the electrically insulating material 16 is higher than the semiconductor chips 12 for about the height $d_1$. In the second process, the electrically insulating material 16 is only deposited on the upper surfaces 17 of the semiconductor chips 12.

It may be provided that after the manufacturing of the redistribution layer the vertical offset between one of the semiconductor chips 12 situated at one end of the carrier 10 and another semiconductor chip 12 located at the opposite end of the carrier 10 is smaller than 3 mm or 1 mm or 100 µm. In particular, the elastic modulus of the adhesive material 11 and the electrically insulating material 16 may be chosen such that this requirement can be fulfilled.

Figure 6A:
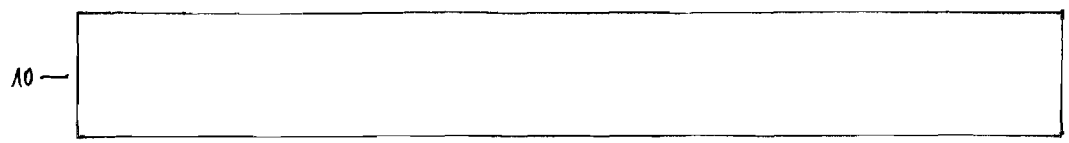
FIGS. 6A to 6K schematically illustrate an exemplary embodiment of a method to fabricate a device.
Figure 6B:
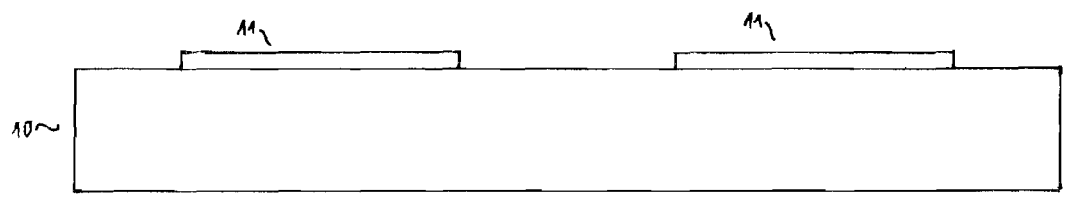
Figure 6C:
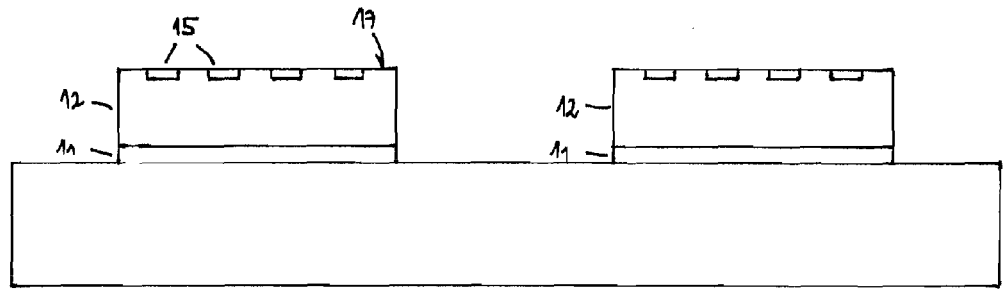
Figure 6D:
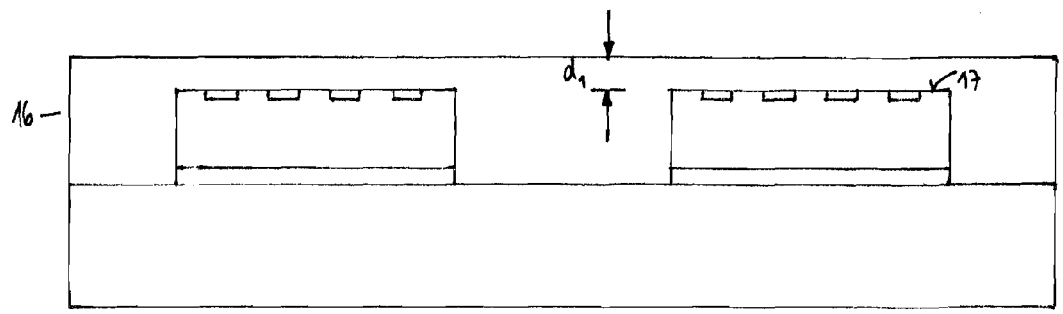
Figure 6E:
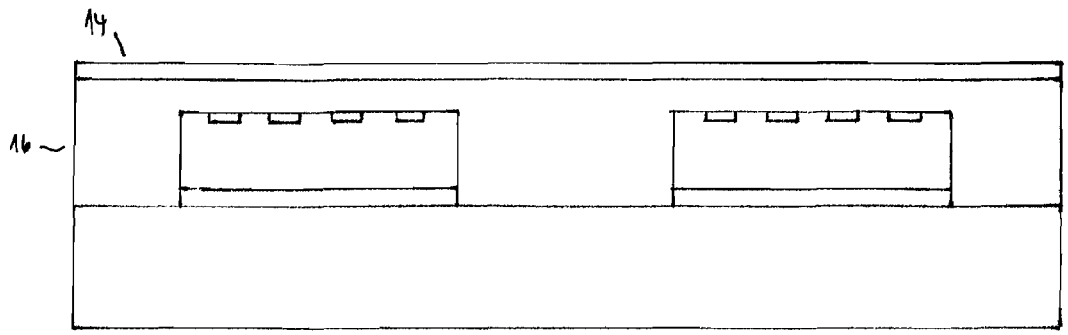
Figure 6F:
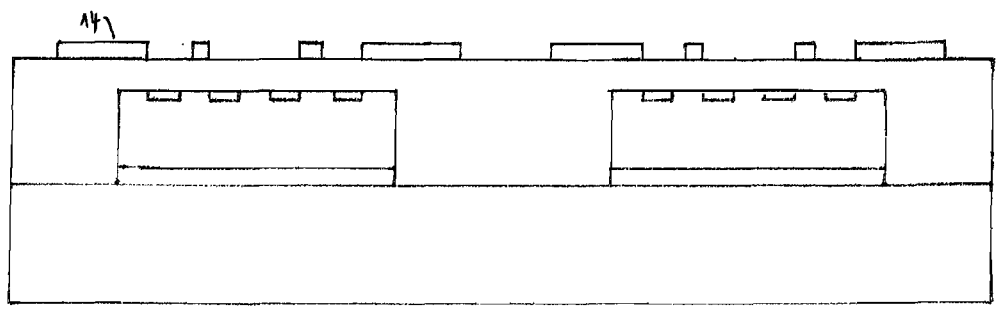
Figure 6G:
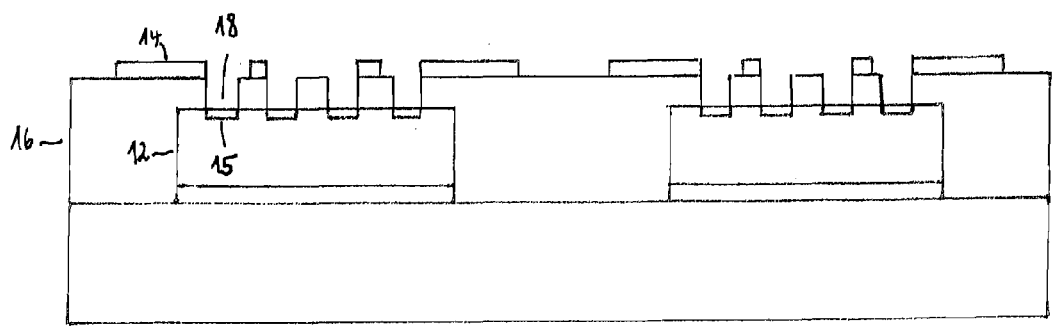
Figure 6H:
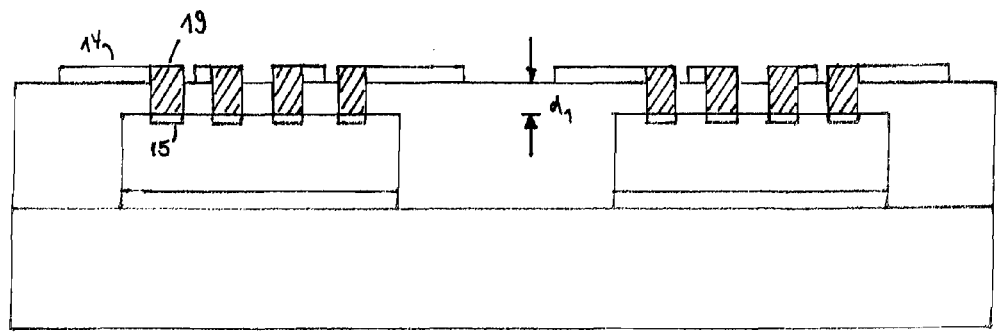
Figure 6I:
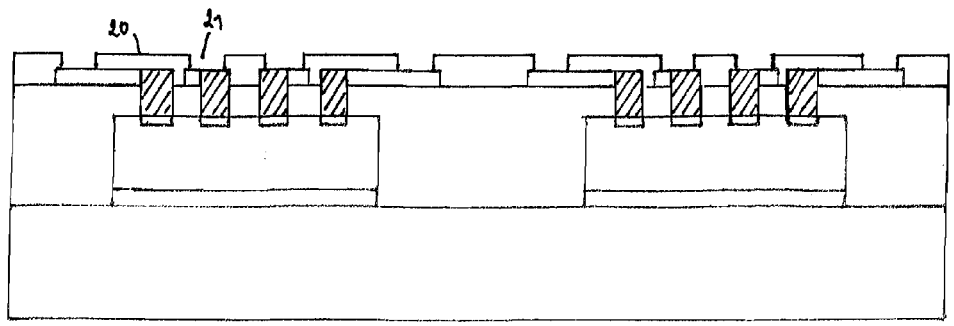
Figure 6J:
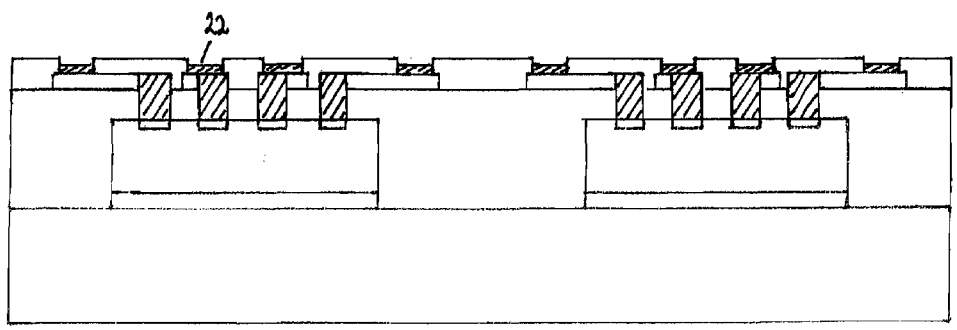
Figure 6K:
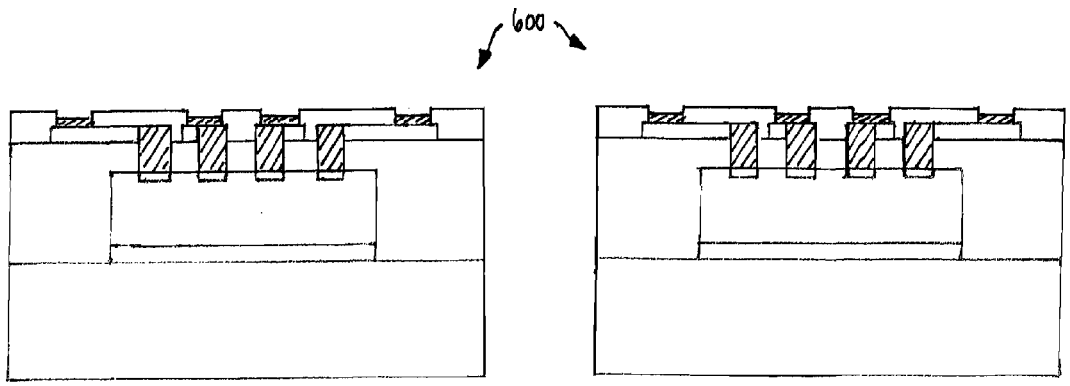

FIGS. 6A to 6K schematically illustrate a method for production of a device 600, a cross section of which is illustrated in FIG. 6K. The method presented in FIGS. 6A to 6K is a further variation of the method illustrated in FIGS. 5A to 5K. Therefore similar or identical components used in both methods are denoted by the same reference numerals. Furthermore, in the following it is sometimes referred to the method of FIGS. 5A to 5K if the same method processes can be carried out as described above.

The method processes illustrated in FIGS. 6A to 6D are identical to the method processes illustrated in FIGS. 5A to 5D. As illustrated in FIG. 6E, after the deposition of the electrically insulating material 16, no cut-outs or through-holes are created in the electrically insulating material 16, but the metal foil 14 is laminated on the upper surface of the electrically insulating material 16 as described above in connection with FIG. 5G. Afterwards, the metal foil 14 is structured as illustrated in FIG. 6F, for example by using the method processes described above in connection with FIG. 5H.

After the structuring of the metal foil 14, the electrically insulating material 16 may be structured to create cut-outs or through-holes 18 reaching from the upper surface of the electrically insulating material 16 down to the contact elements 15 of the semiconductor chips 12 as illustrated in FIG. 6G. The through-holes 18 may be created at those places where the metal foil 14 has been removed. The through-holes 18 may have an embodiment ratio lower than 1.5 or 1. The electrically insulating material 16 may, for example, be structured by laser ablation. Alternative techniques to create the through-holes 18 are chemical etching or photo-lithographic structuring. As a result of the structuring of the electrically insulating material 16, at least portions of the contact elements 15 of the semiconductor chips 12 may be exposed. The exposed surfaces of the contact elements 15 may be cleaned by using RIE or other suitable cleaning techniques.

Solder material 19 may be placed in the through-holes 18 as illustrated in FIG. 6H. The placement of the solder material 19 may be similar to the placement of the solder material 19 as described above in connection with FIG. 5F. The solder material 19 may be melted in order to create an electrical connection between the contact elements 15 and the metal foil 14. As an alternative to the solder material 19, electrically conductive adhesive material may be placed in the through-holes 18. Furthermore, nanopastes, which consist of metal particles having dimensions in the nanometer range, may be used instead of the solder material 19. During application the metal particles may be dispersed in a solvent which evaporates later on.

The manufacturing of the solder stop layer 20 (see FIG. 6I) and the application of the solder material 22 on the external contact pads 21 (see FIG. 6J) as well as the separation into the individual devices 600 (see FIG. 6K) may be similar or identical to the method processes described above in connection with FIGS. 5I to 5K.

Figure 7A:
FIGS. 7A to 7I schematically illustrate an exemplary embodiment of a method to fabricate a device.
Figure 7B:
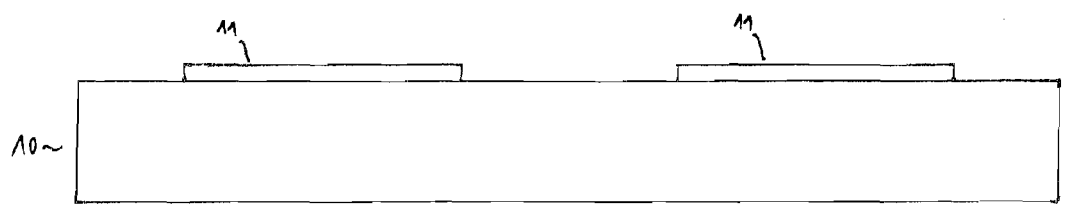
Figure 7C:
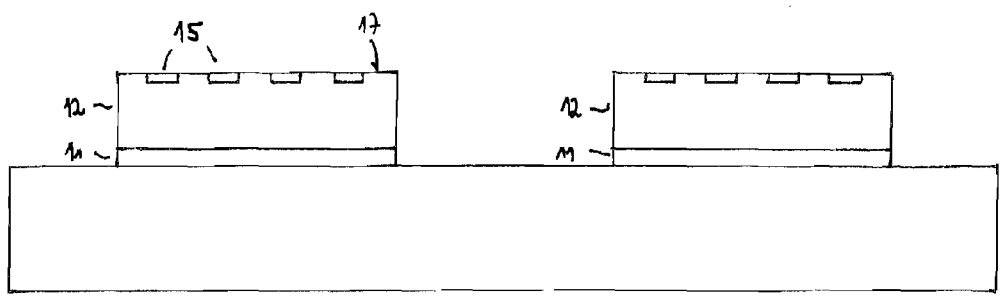
Figure 7D:
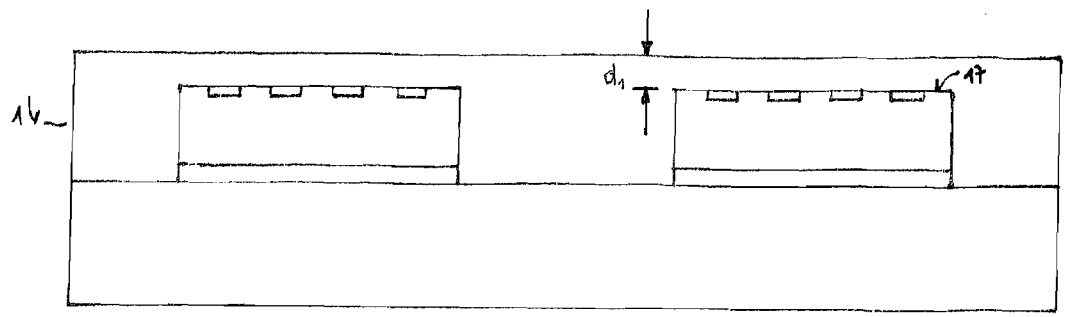
Figure 7E:
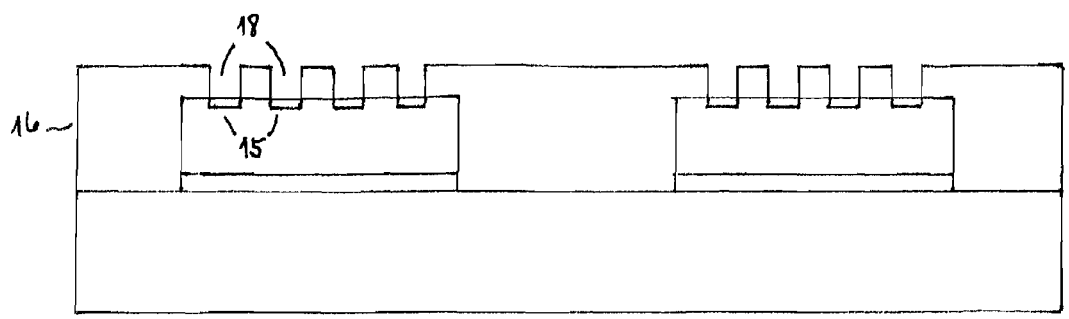
Figure 7F:
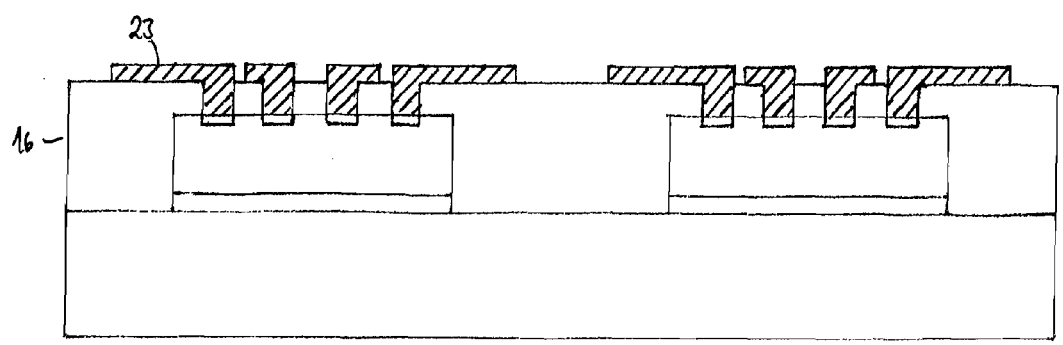
Figure 7G:
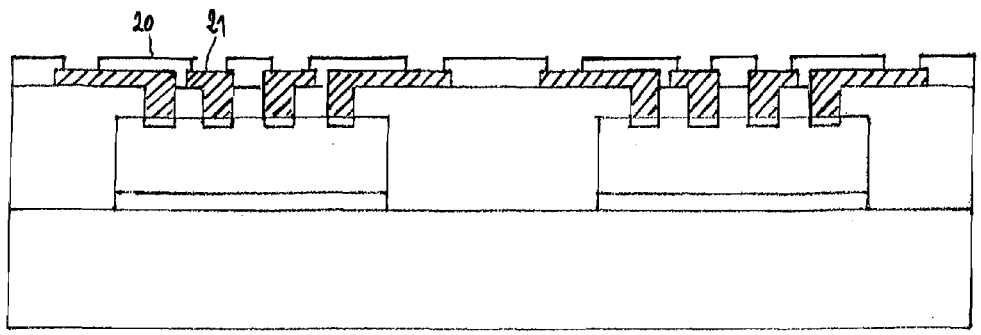
Figure 7H:
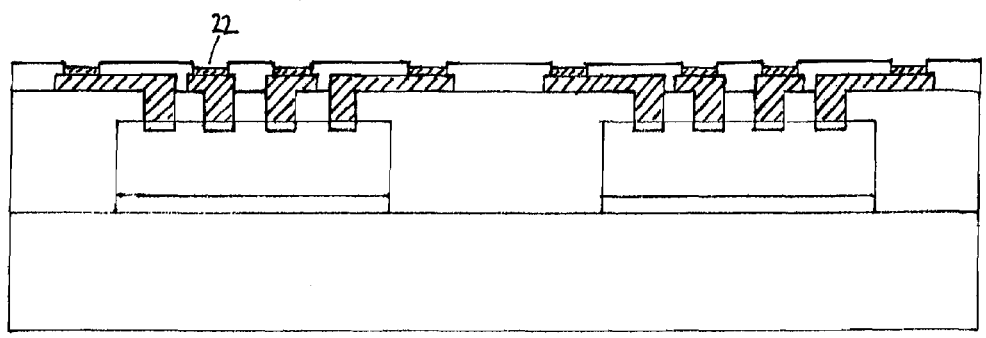
Figure 7I:
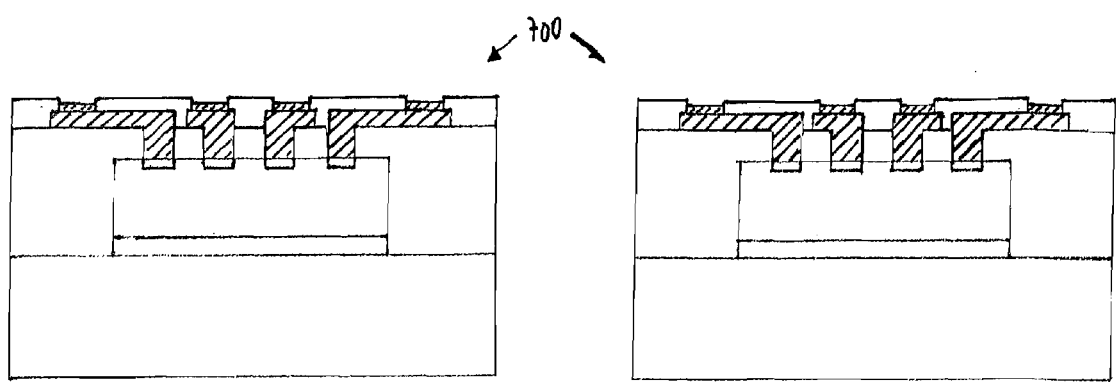

FIGS. 7A to 7I schematically illustrate a method for production of a device 700, a cross section of which is illustrated in FIG. 7I. The method presented in FIGS. 7A to 7I is a further variation of the method illustrated in FIGS. 5A to 5K. Therefore similar or identical components used in both methods are denoted by the same reference numerals. Furthermore, in the following it is sometimes referred to the method of FIGS. 5A to 5K if the same method processes can be carried out as described above.

The method processes illustrated in FIGS. 7A to 7E are identical to the method processes illustrated in FIGS. 5A to 5E. As illustrated in FIG. 7F, after the manufacturing of the through-holes 18 an electrically conductive material 23 is deposited in the through-holes 18 and on the upper surface of the electrically insulating material 16 thereby forming a redistribution layer. The electrically conductive material 23 may not completely fill the through-holes 18, but only coat the walls of the through-holes 18. Prior to the deposition of the electrically conductive material 23, a cleaning process may be carried out, for example by using RIE.

The electrically conductive material 23 may be produced by electroless and/or galvanic plating processes. Thereby a seed layer is first electroless deposited onto the upper surface of the electrically insulating material 16 and the exposed regions of the contact elements 15. Materials such as palladium or titanium may be used for the seed layer which usually has a thickness of less than 1 µm.

The thickness of the seed layer may be increased by depositing a further layer of an electrically conductive material onto the seed layer. For example, a layer of copper may be electroless deposited onto the seed layer. This copper layer may have a thickness of less than 1 µm. Afterwards another layer of copper may be galvanically deposited, which may have a thickness of more than 5 µm. The electroless copper deposition may also be omitted.

Alternatively, the seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 5 µm.

In order to obtain the redistribution layer as illustrated in FIG. 7F, the electrically conductive material 23 may be structured after the completed deposition process of all its layers or after the deposition of the seed layer.

The manufacturing of the solder stop layer 20 (see FIG. 7G) and the application of the solder material 22 on the external contact pads 21 (see FIG. 7H) as well as the separation into the individual devices 700 (see FIG. 7I) may be similar or identical to the method processes described above in connection with FIGS. 5I to 5K.

Figure 8A:
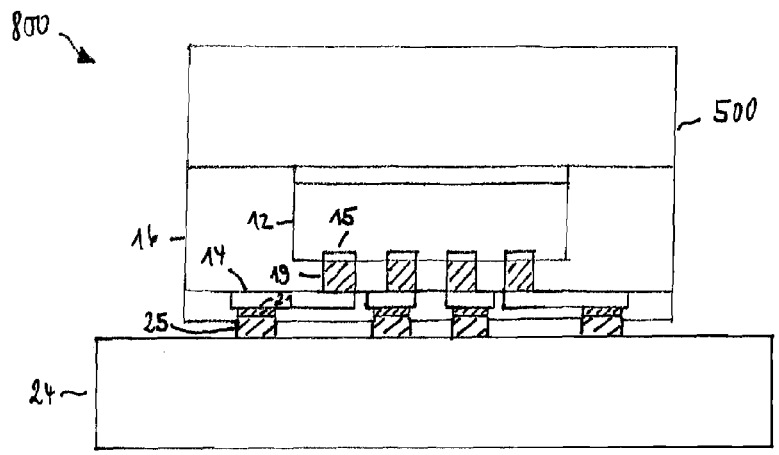
FIGS. 8A to 8E schematically illustrate different perspectives of a device or parts of the device as a further exemplary embodiment.

In FIG. 8A an excerpt of a device 800 is schematically illustrated which includes the device 500 that is mounted onto a circuit board 24, for example a PCB. The external contact pads 21 may have been soldered to contact pads of the circuit board 24 by using solder deposits 25.

Figure 8B:
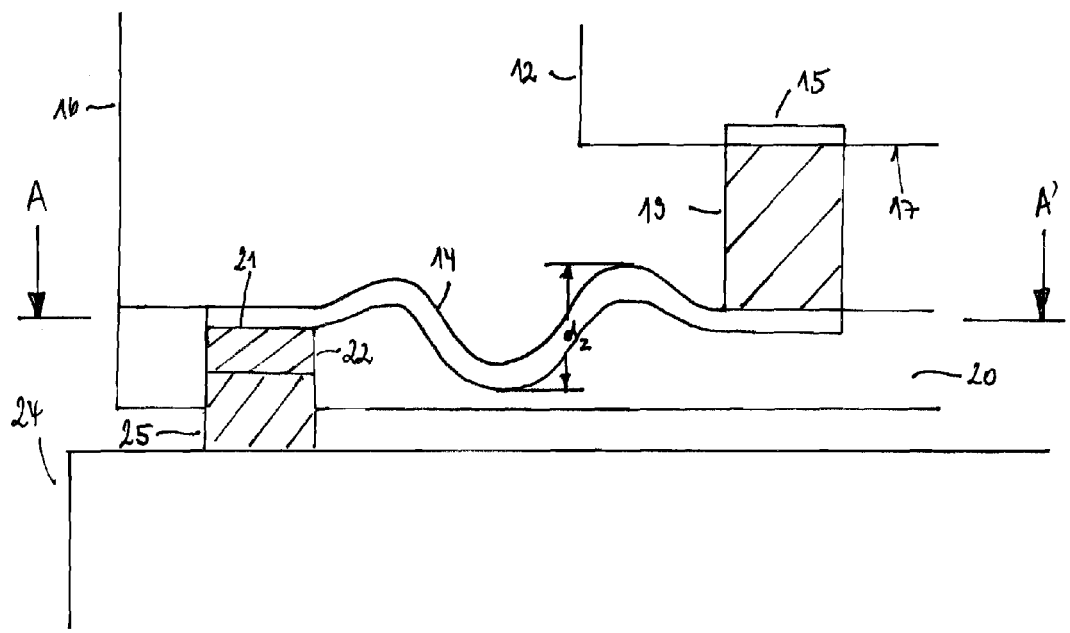

In order to illustrate an embodiment of the metal foil 14, a part of the device 800 is enlarged in FIG. 8B. As can be seen from FIG. 8B, at least a portion of the metal foil 14 which electrically couples the contact element 15 to the external contact pad 21 has a cross section in a direction orthogonal to the main active surface 17 of the semiconductor chip 12 that has a continuously curved form. Thus, the metal foil 14 is not completely flat, but may have a waved structure as illustrated in FIG. 8B. The waved structure of the metal foil 14 may prevent metal fatigue during TCoB (temperature cycles on board) stress tests and when cooling down from the solder peak temperature after soldering of the device 500 on the circuit board 24. The curved or spring shape of the metal foil 14 may prevent disruption of the metal foil 14 in particular if the thermal expansion coefficient of the semiconductor chip 12 differs from the thermal expansion coefficient of the circuit board 24.

Peak-to-peak distance $d_2$ of the metal foil 14 as illustrated in FIG. 8B may be in the range between 10 and 100 μm. The curved structure of the metal foil 14 may be caused by a curved surface of the underlying electrically insulating material 16. When depositing the electrically insulating material 16, a printing technique, such as screen printing, may be utilized which allows to produce a curved surface of the electrically insulating material 16. Alternatively, a laser beam may be used to produce the waved surface of the electrically insulating material 16.

Figure 8C:
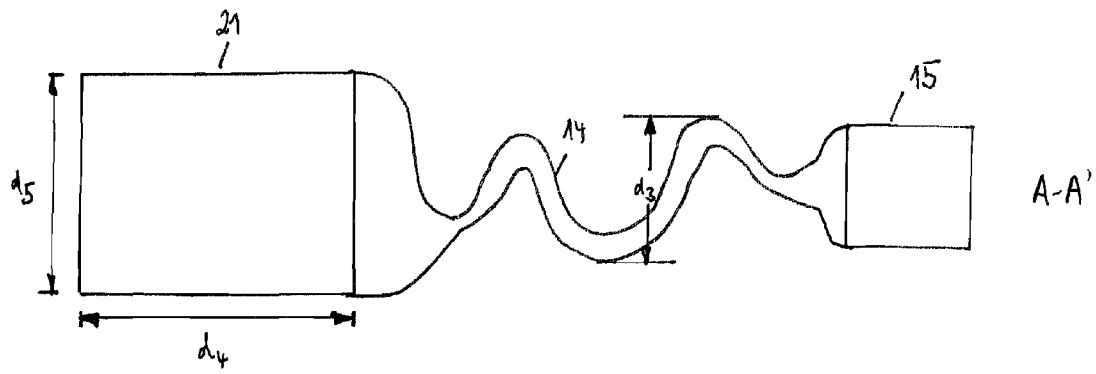

FIG. 8C illustrates a part of the cross section of the device 500 along the line A-A' illustrated in FIG. 8B. As can be seen from FIG. 8C, an electrically conductive line 14 that has been produced by structuring the metal foil 14 has a cross section in a direction parallel to the active main surface 17 of the semiconductor chip 12 that has a continuously curved form, for example a meander or waved structure. The meander or waved structure of the electrically conductive line 14 may prevent metal fatigue during TCoB (temperature cycles on board) stress tests and when cooling down from the solder peak temperature after soldering of the device 500 on the circuit board 24. The curved or spring shape of the electrically conductive line 14 as illustrated in FIG. 8C may prevent disruption of the electrically conductive line 14 in particular if the thermal expansion coefficient of the semiconductor chip 12 differs from the thermal expansion coefficient of the circuit board 24. The electrically conductive line 14 may be oriented towards the direction of TCoB stress, which may be oriented towards the center of the device 500. The sections of the electrically conductive line 14 that are coupled to the contact element 15 or the external contact pad 21 may be enlarged.

Peak-to-peak distance $d_3$ of the electrically conductive line 14 as illustrated in FIG. 8C may be in the range between twice the line width and hundred times of the line width of the electrically conductive line 14. Adjacent electrically conductive lines may have similar or identical shapes allowing a dense arrangement of the electrically conductive lines. The meander or waved structure of the electrically conductive line 14 may be produced by laser structuring or photo-lithographic structuring of the metal foil 14 during the production of the redistribution layer. For rapid prototyping the metal foil 14 or the seed layer may be structured directly by using a laser beam.

The external contact pad 21 may have a rectangular shape having side lengths $d_4$ and $d_5$. The side length $d_4$ which is oriented towards the main direction of the electrically conductive line 14 may be larger than the side length $d_5$.

It may be provided that the electrically conductive line 14 exhibits only the continuously curved shape similar to the one illustrated in FIG. 8B or only the continuously curved shape similar to the one illustrated in FIG. 8C or that the electrically conductive line 14 is curved in directions orthogonal and parallel to the active main surface 17 of the semiconductor chip 12.

Figure 8D:
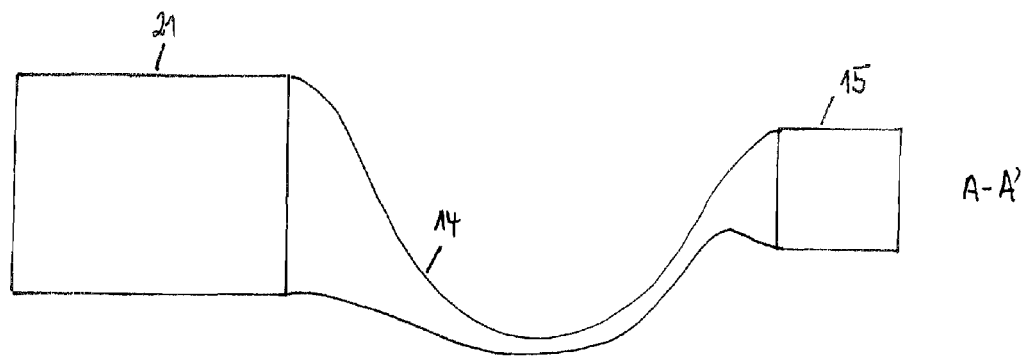
Figure 8E:
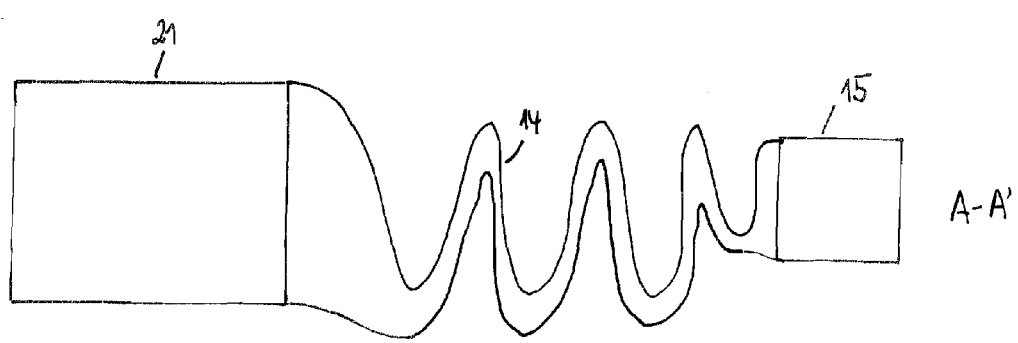

Variations of the meander or curved structure of the electrically conductive line 14 as illustrated in FIG. 8C are illustrated in FIGS. 8D and 8E.

In addition, while a particular feature or embodiment of an embodiment of the invention may have been disclosed with respect to only one of several implementations, such feature or embodiment may be combined with one or more other features or embodiments of the other implementations as may be desired and for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   providing a carrier;
   depositing a first material on the carrier, the first material comprising silicone;
   placing at least two semiconductor chips over the first material, each of the at least two semiconductor chips having an active main surface facing away from the first material; and
   applying a metal layer over the active main surfaces of the at least two semiconductor chips, wherein the metal layer has a continuous sinusoidal waved structure in a direction orthogonal to the active main surfaces of the at least two semiconductor chips.

2. The method of claim 1, wherein the first material is electrically insulating.

3. The method of claim 1, wherein a second electrically insulating material is deposited over the at least two semiconductor chips, the second electrically insulating material comprising silicone.

4. The method of claim 3, wherein the second electrically insulating material is opened for accessing the at least two semiconductor chips.

5. The method of claim 4, wherein an electrically conductive material is deposited in the opening of the second electrically insulating material.

6. The method of claim 1, wherein the first material has an elastic modulus of less than 100 MPa.

7. The method of claim 1, wherein one of the at least two semiconductor chips is separated from the other semiconductor chip of the at least two semiconductor chips after applying the metal layer.

8. A method, comprising:
   attaching at least two semiconductor chips to a carrier, the at least two semiconductor chips comprising at least one contact element on an active main surface;
   covering the carrier and the at least two semiconductor chips with an electrically insulating material;
   applying a metal foil over the at least two semiconductor chips, wherein the metal foil has a continuous sinusoidal waved structure in a direction orthogonal to the active main surfaces of the at least two semiconductor chips; and
   soldering the metal foil to the at least one contact element.

9. The method of claim 8, wherein the electrically insulating material is opened for accessing the at least one contact element.

10. The method of claim 9, wherein the metal foil is partially removed before the electrically insulating material is opened.

11. The method of claim 8, wherein a solder material is applied to the at least one contact element.

12. The method of claim 11, wherein the solder material is applied to the at least one contact element before attaching the at least two semiconductor chips to the carrier.

13. The method of claim 11, wherein the solder material is applied to the at least one contact element after applying the metal foil over the at least two semiconductor chips.

14. The method of claim 8, wherein the metal foil is laminated on the electrically insulating material.

15. The method of claim 8, wherein the metal foil have a waved structure in a direction parallel to the active main surfaces of the at least two semiconductor chips.

16. The method of claim 8, including forming the electrically insulating material to have a surface having a continuous sinusoidal waved structure in a direction orthogonal to the active main surfaces of the at least two semiconductor chips, and applying the metal foil includes applying the metal foil on the surface of the electrically insulating material.

17. The method of claim 1, wherein a peak-to-peak distance between waves of the waved structure in the direction orthogonal to the active main surfaces is in a range from 10 to 100 μm.

18. The method of claim 8, wherein a peak-to-peak distance between waves of the waved structure in the direction orthogonal to the active main surfaces is in a range from 10 to 100 μm.

* * * * *